United States Patent
Noguchi et al.

(10) Patent No.: US 11,735,673 B2
(45) Date of Patent: Aug. 22, 2023

(54) SEMICONDUCTOR DEVICE FOR IMPROVING PERFORMANCE OF A BLOCK INSULATOR AND METHOD OF MANUFACTURING THE SAME

(71) Applicant: Kioxia Corporation, Tokyo (JP)

(72) Inventors: Masaki Noguchi, Yokkaichi (JP); Akira Takashima, Fuchu (JP)

(73) Assignee: Kioxia Corporation, Tokyo (JP)

( * ) Notice: Subject to any disclaimer, the term of this patent is extended or adjusted under 35 U.S.C. 154(b) by 8 days.

(21) Appl. No.: 17/019,662

(22) Filed: Sep. 14, 2020

(65) Prior Publication Data
US 2021/0257500 A1    Aug. 19, 2021

(30) Foreign Application Priority Data
Feb. 14, 2020 (JP) .................. 2020-023497

(51) Int. Cl.
*H01L 29/66* (2006.01)
*H10B 43/27* (2023.01)
*H01L 29/786* (2006.01)
*H01L 29/04* (2006.01)
*H01L 29/792* (2006.01)
*H10B 43/30* (2023.01)

(52) U.S. Cl.
CPC ........ *H01L 29/78693* (2013.01); *H01L 29/04* (2013.01); *H01L 29/66833* (2013.01); *H01L 29/792* (2013.01); *H10B 43/27* (2023.02); *H10B 43/30* (2023.02)

(58) Field of Classification Search
CPC ............. H01L 29/66833; H01L 29/792; H01L 29/78693; H01L 29/04; H01L 27/11568; H10B 43/27; H10B 43/30; H10B 43/35
See application file for complete search history.

(56) References Cited

U.S. PATENT DOCUMENTS

| 8,062,978 B2 | 11/2011 | Choi et al. |
| 9,406,694 B1* | 8/2016 | Ikeno .................. H01L 21/764 |
| 9,997,526 B2 | 6/2018 | Sudo et al. |

(Continued)

FOREIGN PATENT DOCUMENTS

| JP | 2009-55030 A | 3/2009 |
| JP | 2009-132961 A | 6/2009 |

(Continued)

OTHER PUBLICATIONS

Wefers, K. et al., "Oxides and Hydroxides of Aluminum," Alcoa Technical Paper, No. 19, Revised, Alcoa Laboratories, 1987, 100 pages.

*Primary Examiner* — Laura M Menz
*Assistant Examiner* — Candice Chan
(74) *Attorney, Agent, or Firm* — Oblon, McClelland, Maier & Neustadt, L.L.P.

(57) ABSTRACT

In one embodiment, a semiconductor device includes a stacked film including electrode layers and insulating layers that are alternately stacked in a first direction. The device further includes a first insulator, a charge storage layer, a second insulator and a semiconductor layer that are provided in the stacked film. The device further includes a third insulator provided between an electrode layer and an insulating layer and between the electrode layer and the first insulator, and including aluminum oxide having an α crystal phase.

7 Claims, 8 Drawing Sheets

(56) References Cited

U.S. PATENT DOCUMENTS

| 10,566,280 B2 | 2/2020 | Wakatsuki et al. |
| 2009/0239367 A1 | 9/2009 | Kim et al. |
| 2019/0279932 A1 | 9/2019 | Wakatsuki et al. |
| 2020/0279957 A1* | 9/2020 | Noguchi ................ H10B 43/27 |

FOREIGN PATENT DOCUMENTS

| JP | 2019-160918 A | 9/2019 |
| TW | I643254 B | 12/2018 |

* cited by examiner

SEMICONDUCTOR DEVICE FOR IMPROVING PERFORMANCE OF A BLOCK INSULATOR AND METHOD OF MANUFACTURING THE SAME

CROSS REFERENCE TO RELATED APPLICATION

This application is based upon and claims the benefit of priority from the prior Japanese Patent Application No. 2020-023497, filed on Feb. 14, 2020, the entire contents of which are incorporated herein by reference.

FIELD

Embodiments described herein relate to a semiconductor device and a method of manufacturing the same.

BACKGROUND

A block insulator of a three-dimensional memory is formed, for example, to include a metal insulator such as an aluminum oxide film, in addition to a silicon oxide film. For improving the performance of the block insulator, it is desired to form the block insulator to include a suitable metal insulator.

DETAILED DESCRIPTION

In one embodiment, a semiconductor device includes a stacked film including electrode layers and insulating layers that are alternately stacked in a first direction. The device further includes a first insulator, a charge storage layer, a second insulator and a semiconductor layer that are provided in the stacked film. The device further includes a third insulator provided between an electrode layer and an insulating layer and between the electrode layer and the first insulator, and including aluminum oxide having an α crystal phase.

Embodiments will now be explained with reference to the accompanying drawings. In FIGS. 1 to 8, the same components are denoted by the same reference symbols and duplicate descriptions thereof will be omitted.

First Embodiment

Figure 1:
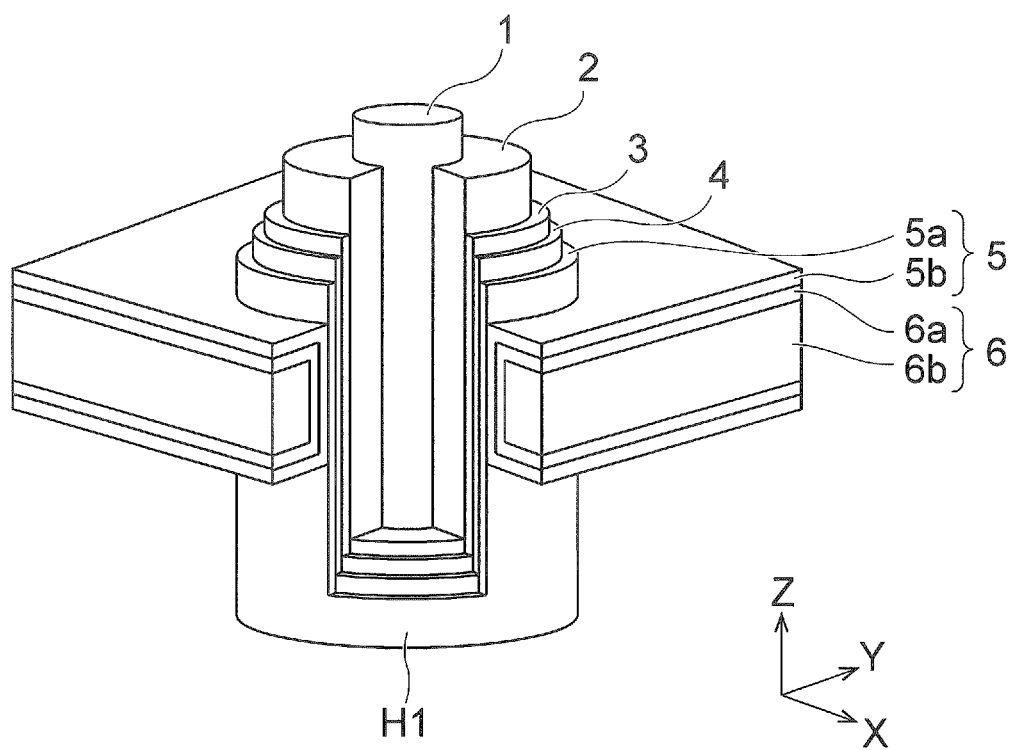
FIG. 1 is a perspective view illustrating the structure of a semiconductor device of a first embodiment.

FIG. 1 is a perspective view illustrating the structure of a semiconductor device of a first embodiment. The semiconductor device illustrated in FIG. 1 is, for example, a three-dimensional NAND memory.

The semiconductor device illustrated in FIG. 1 includes a core insulator 1, a channel semiconductor layer 2, a tunnel insulator 3, a charge storage layer 4, a block insulator 5, and an electrode layer 6. The block insulator 5 includes an insulator 5$a$ and an insulator 5$b$. The electrode layer 6 includes a barrier metal layer 6$a$ and an electrode material layer 6$b$. The insulator 5$a$ in the block insulator 5 is an example of a first insulator, and the tunnel insulator 3 is an example of a second insulator. Further, the insulator 5$b$ in the block insulator 5 is an example of a third insulator.

In FIG. 1, a plurality of electrode layers and a plurality of insulating layers are alternately stacked on a substrate, and a memory hole H1 is provided in the electrode layers and the insulating layers, although illustrated in FIG. 1 is only one electrode layer 6 of these electrode layers. These electrode layers function as, for example, word lines of the NAND memory. FIG. 1 illustrates X and Y directions that are parallel to a surface of the substrate and are perpendicular to each other, and Z direction that is perpendicular to the surface of the substrate. In the present specification, +Z direction is treated as an upward direction, and −Z direction is treated as a downward direction. The −Z direction may or may not match the direction of gravity. The Z direction is an example of a first direction.

The core insulator 1, the channel semiconductor layer 2, the tunnel insulator 3, the charge storage layer 4, and the insulator 5$a$ are formed in the memory hole H1, and configure a memory cell of the NAND memory. The insulator 5$a$ is formed on surfaces of the electrode layers and the insulating layers in the memory hole H1. The charge storage layer 4 is formed on a surface of the insulator 5$a$. The charge storage layer 4 can store electric charges between an outer side face and an inner side face. The tunnel insulator 3 is formed on a surface of the charge storage layer 4, and the channel semiconductor layer 2 is formed on a surface of the tunnel insulator 3. The channel semiconductor layer 2 functions as a channel of the memory cell. The core insulator 1 is formed in the channel semiconductor layer 2.

The insulator 5$a$ is, for example, a silicon oxide film ($SiO_2$ film). The charge storage layer 4 is, for example, a silicon nitride film (SiN film). The tunnel insulator 3 is, for example, a stacked film including a silicon oxynitride film (SiON film) and an $SiO_2$ film. The channel semiconductor layer 2 is, for example, a polysilicon layer. The core insulator 1 is, for example, an $SiO_2$ film.

The insulator 5$b$, the barrier metal layer 6$a$, and the electrode material layer 6$b$ are formed between insulating layers neighboring with each other, and are sequentially formed on a lower face of an upper insulating layer, an upper face of a lower insulating layer, and a side face of the insulator 5$a$. The insulator 5$b$ is, for example, a metal insulator such as an aluminum oxide film ($Al_2O_3$ film). The barrier metal layer 6$a$ is, for example, a titanium nitride film (TiN film). The electrode material layer 6$b$ is, for example, a tungsten (W) layer.

Hereinafter, the insulator 5$b$ of the present embodiment will be described in detail.

The insulator 5$b$ is, for example, an $Al_2O_3$ film in an α crystal phase. The $Al_2O_3$ film in the α crystal phase has a dielectric constant comparable to that of an $Al_2O_3$ film in a γ crystal phase, which is a general $Al_2O_3$ film. On the other hand, the barrier height of the $Al_2O_3$ film in the α crystal phase with respect to a silicon (Si) layer is 0.7 eV higher than the barrier height of the $Al_2O_3$ film in the γ crystal phase with respect to the Si layer. The barrier height difference of 0.7 eV is effective in reducing the back-tunneling current from the word line during an erasure operation of the NAND memory. Therefore, according to the present embodiment, forming the $Al_2O_3$ film in the α crystal phase as the insulator 5b makes it possible to reduce the leakage current of the NAND memory.

Although the $Al_2O_3$ film in the γ crystal phase has a metastable structure, which may be referred to as defective spinel structure, the $Al_2O_3$ film in the α crystal phase has a most stable structure, which may be referred to as corundum structure. In the $Al_2O_3$ film in the γ crystal phase, $O^{2-}$ ions configure a face-centered cubic lattice, and $Al^{3+}$ ions have a coordination number of 6 or 4. On the other hand, in the $Al_2O_3$ film in the α crystal phase, $O^{2-}$ ions configure a hexagonal closest packing, and $Al^{3+}$ ions regularly occupy ⅔ of 6 coordination sites. Such differences between the $Al_2O_3$ film in the γ crystal phase and the $Al_2O_3$ film in the α crystal phase makes it possible to specify whether the $Al_2O_3$ film is in the γ crystal phase or in the α crystal phase by X-ray diffraction.

FIGS. 2 to 5 are cross-sectional views illustrating a method of manufacturing the semiconductor device of the first embodiment.

Figure 2:
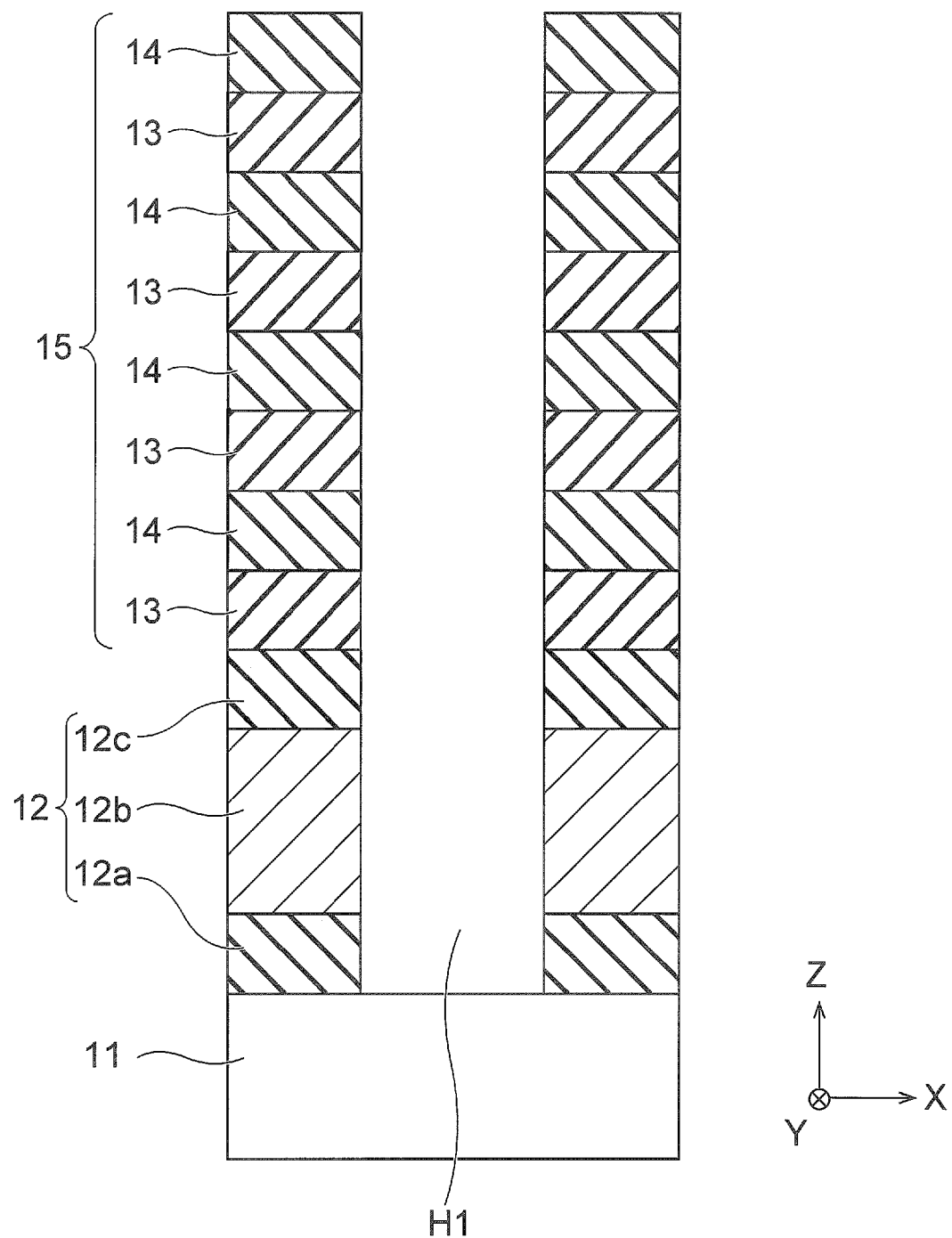
FIGS. 2 to 5 are cross-sectional views illustrating a method of manufacturing the semiconductor device of the first embodiment.

First, a ground layer 12 is formed on a substrate 11, and a plurality of sacrificial layers 13 and a plurality of insulating layers 14 are alternately formed on the ground layer 12 (FIG. 2). As a result, a stacked film 15 including the plurality of sacrificial layers 13 and the plurality of insulating layers 14 alternately formed on the ground layer 12. The memory hole H1 is then formed to penetrate the stacked film 15 and the ground layer 12 (FIG. 2). As a result, an upper face of the substrate 11 is exposed to the inside of the memory hole H1.

The substrate 11 is, for example, a semiconductor substrate such as an Si substrate. The ground layer 12 is, for example, a stacked film including a lower insulator 12a, a semiconductor layer 12b, and an upper insulator 12c, which are sequentially provided on the substrate 11. The lower insulator 12a is, for example, a stacked film including an $SiO_2$ film, or an $SiO_2$ film, and another insulator. The semiconductor layer 12b is, for example, a polysilicon layer. The upper insulator 12c is, for example, is a stacked film including an $SiO_2$ film, or an $SiO_2$ film, and another insulator. The sacrificial layer 13 is, for example, an SiN film, and the insulating layer 14 is, for example, an $SiO_2$ film. The sacrificial layer 13 is an example of a first film. The memory hole H1 may be formed so as to reach the semiconductor layer above the substrate 11, instead of being formed so as to reach the substrate 11.

Figure 3:
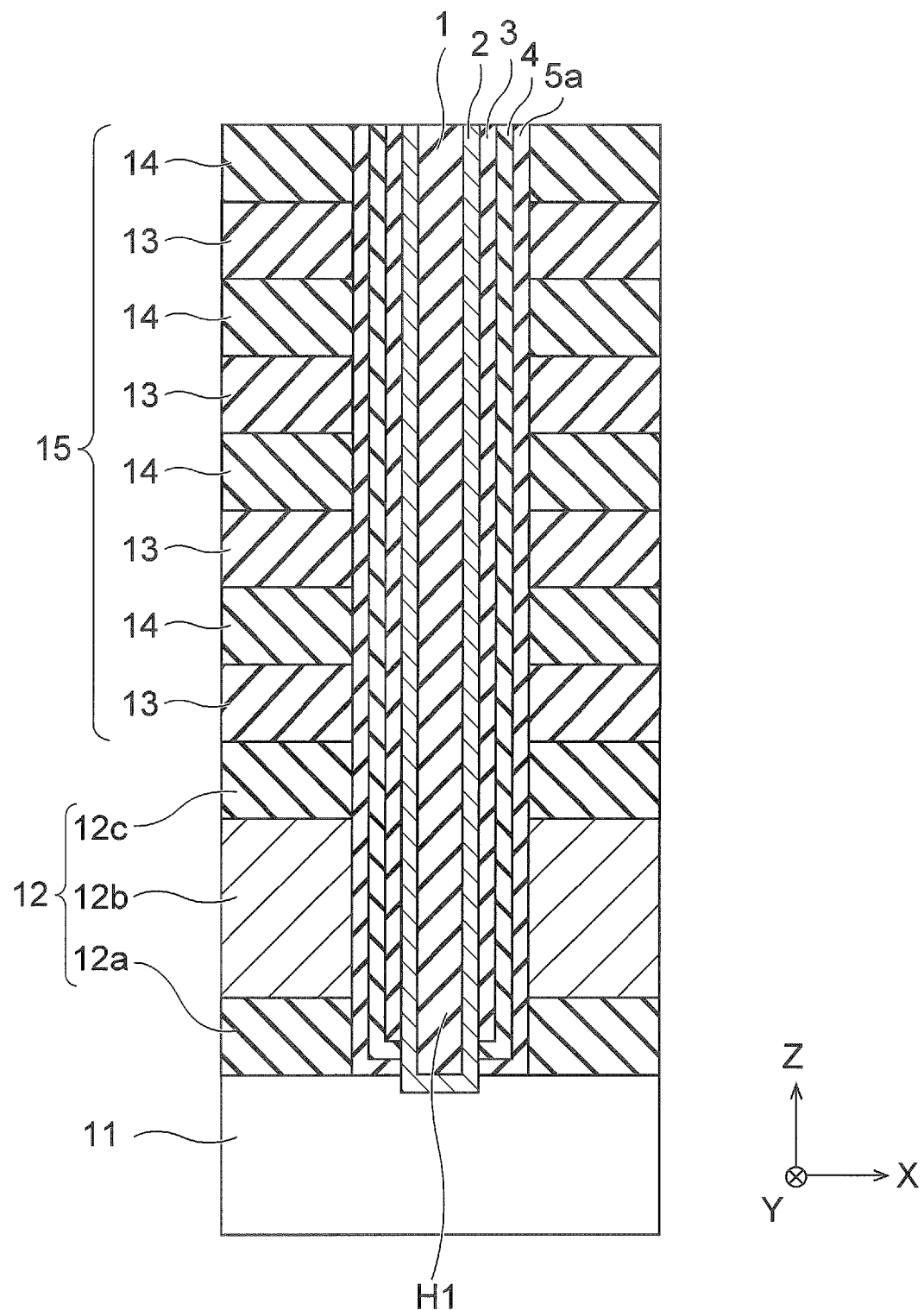

Next, the insulator 5a, the charge storage layer 4, and the tunnel insulator 3 are sequentially formed on the surfaces of the substrate 11, the ground layer 12, and the stacked film 15 in the memory hole H1 (FIG. 3). Next, the insulator 5a, the charge storage layer 4 and the tunnel insulator 3 are subsequently removed from a bottom portion of the memory hole H1 by etching (FIG. 3). As a result, the upper face of the substrate 11 is exposed again in the memory hole H1. Next, the channel semiconductor layer 2 and the core insulator 1 are sequentially formed on the surfaces of the substrate 11 and the tunnel insulator 3 in the memory hole H1 (FIG. 3). As a result, the insulator 5a, the charge storage layer 4, the tunnel insulator 3, the channel semiconductor layer 2, and the core insulator 1 are sequentially formed on side faces of the ground layer 12 and the stacked film 15 in the memory hole H1.

Figure 4:
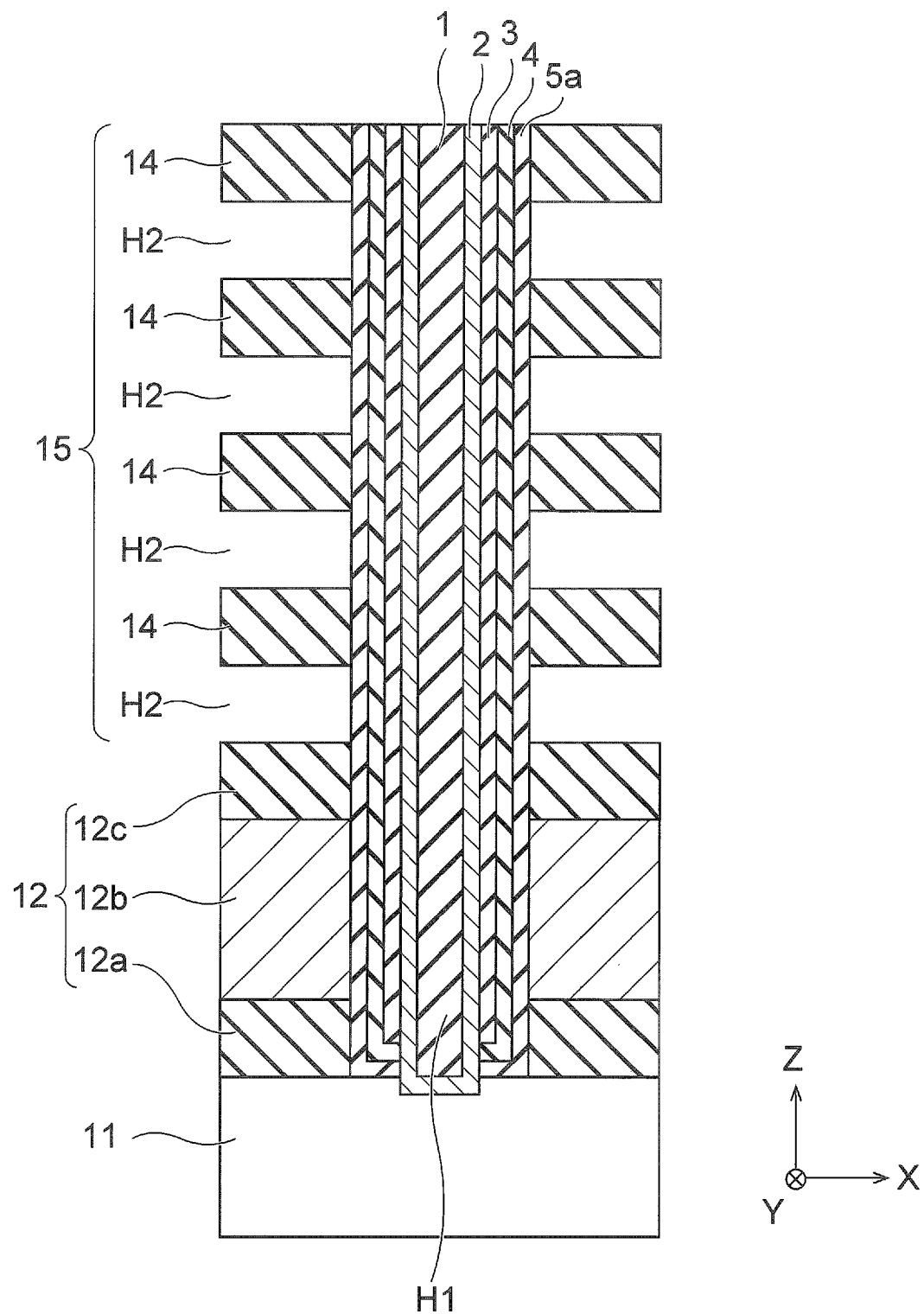

Next, a slit (not illustrated) is formed in the stacked film 15, and the sacrificial layers 13 are removed with a chemical solution such as phosphoric acid by using this slit. As a result, plural cavities H2 are formed between the insulating layers 14 (FIG. 4). These cavities H2 are examples of a concave portion.

Figure 5:
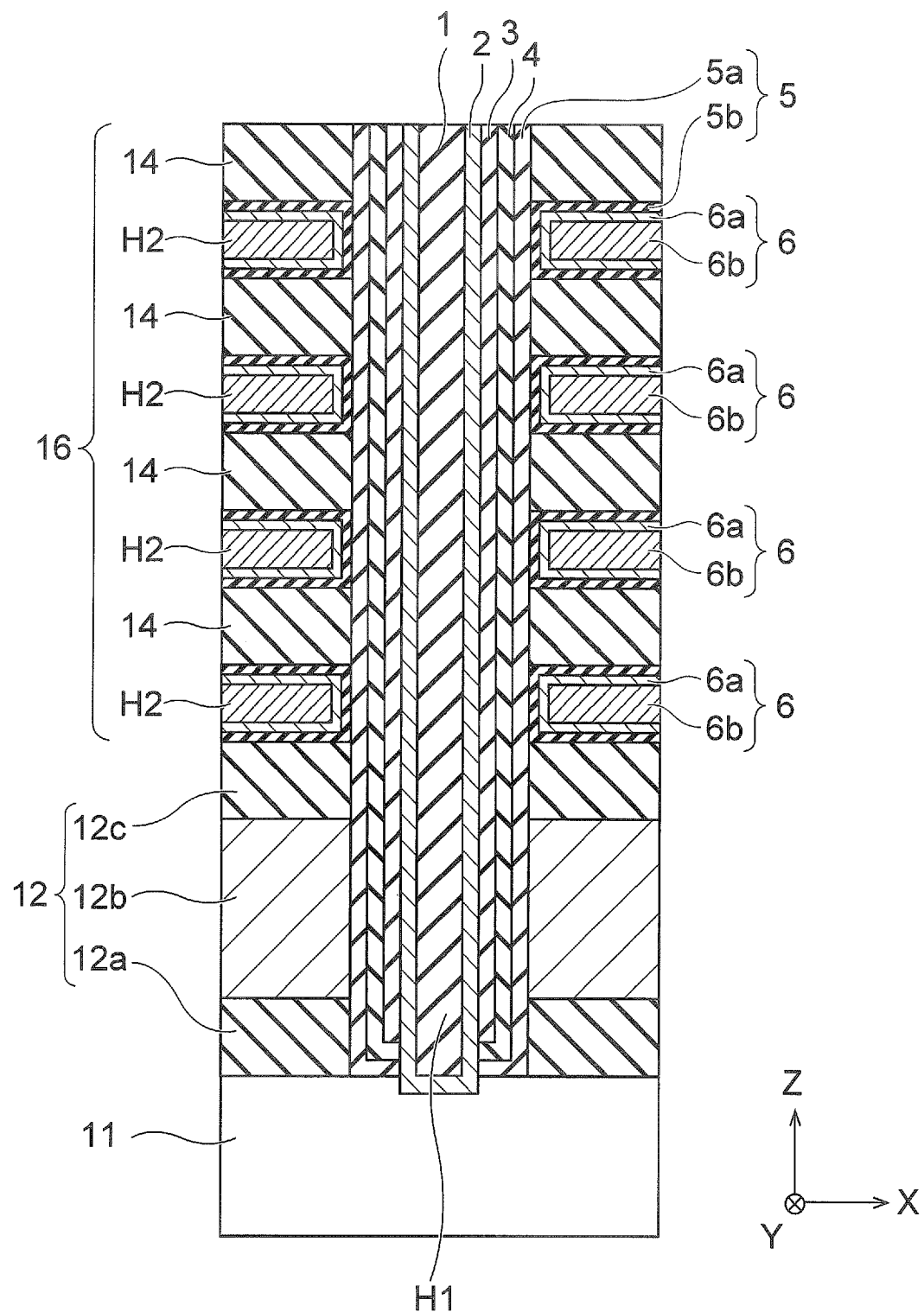

Next, the insulator 5b, the barrier metal layer 6a and the electrode material layer 6b are sequentially formed on the surfaces of the insulating layer 14 and the insulator 5a in these cavities H2 (FIG. 5). As a result, the block insulator 5 including the insulator 5a and the insulator 5b is formed. Further, the electrode layer 6 including the barrier metal layer 6a and the electrode material layer 6b is formed in each cavity H2. A stacked film 16 alternately including the plurality of electrode layers 6 and the plurality of insulating layers 14 is formed on the ground layer 12.

In each cavity H2, the insulator 5b, the barrier metal layer 6a, and the electrode material layer 6b are formed between an upper insulating layer 14 and a lower insulating layer 14. Therefore, the insulator 5b in each cavity H2 is formed on a lower face of the upper insulating layer 14, an upper face of the lower insulating layer 14, and a side face of the insulator 5a, and is sandwiched between the upper insulating layer 14, the lower insulating layer 14, the insulator 5a, and the barrier metal layer 6a. As described above, the insulator 5b of the present embodiment is, for example, the $Al_2O_3$ film in the α crystal phase. A method of forming the insulator 5b will be described in detail below.

In this manner, the semiconductor device of the present embodiment is manufactured (FIG. 5). FIG. 1 illustrates a portion of the semiconductor device illustrated in FIG. 5.

Figure 6A:
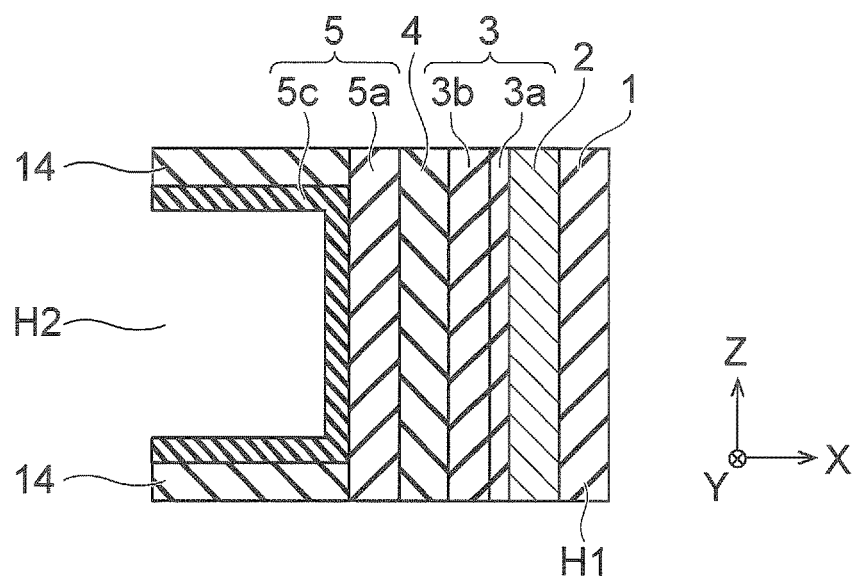
FIGS. 6A to 6C are cross-sectional views illustrating details of the method of manufacturing the semiconductor device of the first embodiment.
Figure 6B:
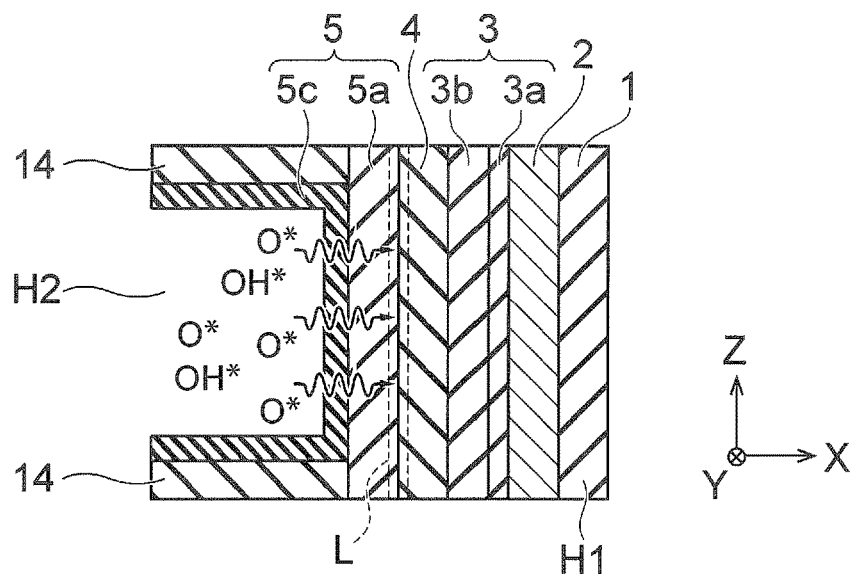
Figure 6C:
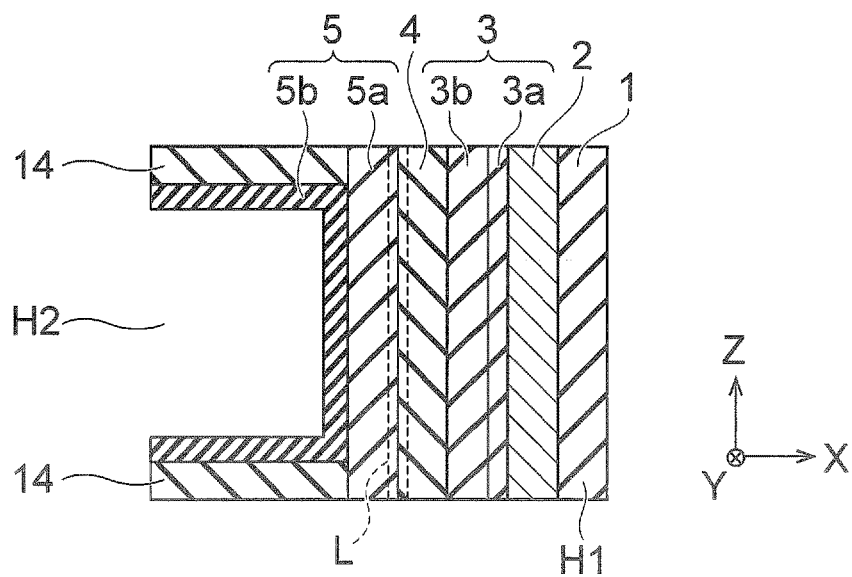

FIGS. 6A to 6C are cross-sectional views illustrating details of the method of manufacturing the semiconductor device of the first embodiment. FIGS. 6A to 6C illustrate details of a process of forming the insulator 5b illustrated in FIG. 5.

First, the insulator 5c are formed on the surfaces of the insulating layers 14 and the insulator 5a in the cavity H2 (FIG. 6A). The insulator 5c is, for example, an aluminum compound film that is different from the $Al_2O_3$ film. An example of the insulator 5c is an aluminum nitride film (AlN film), which is an aluminum compound film in an amorphous phase. The insulator 5c is an example of a second film. FIG. 6A illustrates an insulator 3a (e.g., $SiO_2$ film) and an insulator 3b (e.g., SiON film) included in the tunnel insulator 3.

The insulator 5c (AlN film) of the present embodiment is formed by atomic layer deposition (ALD) in a vertical depressurization batch furnace. Specifically, the insulator 5c is formed by using trimethylaluminum (TMA, $Al(CH_3)_3$), as a source gas, and ammonia ($NH_3$), as a nitriding agent, at a temperature range of 300 to 400° C. The thickness of the insulator 5c can be controlled by adjusting the number of ALD cycles. In the present embodiment, as described below, the insulator 5c is changed to the insulator 5b by changing the AlN film in the amorphous phase to the $Al_2O_3$ film in the α crystal phase by thermal oxidation. According to this thermal oxidation, oxidation and crystallization of the insulator 5c proceed simultaneously, and the insulator 5c is changed to the insulator 5b.

The insulator 5c may be another aluminum compound film. Another example of the insulator 5c is an aluminum compound film in an amorphous phase that includes an aluminum (Al) element and a nitrogen (N) element, and includes, for example, an aluminum oxynitride film (AlON film), an aluminum carbonitride film (AlCN film), and an aluminum carboxynitride film (AlCON film). The insulator 5c may be any other insulator as long as it is formed as an aluminum compound film having no crystal phase and if oxidation and crystallization proceed simultaneously by thermal oxidation. Further, although TMA, which is a liquefied gas, is used to from the insulator 5c in the present embodiment, a solid material such as $AlCl_3$ (aluminum chloride) may also be used to form the insulator 5c by sublimation.

Next, the insulator 5c are thermally oxidized (FIG. 6B). As a result, oxidation and crystallization of the insulator 5c proceed simultaneously, and the insulator 5c (AlN film in the amorphous phase) is changed into the insulator 5b ($Al_2O_3$ film in the α crystal phase) (FIG. 6C).

In the present embodiment, heat application and oxidation are simultaneously performed by radical oxidation to change the insulator 5c to the insulator 5b. For example, the insulator 5c having a thickness of 2.3 to 2.5 nm is radically oxidized in a temperature range of 930 to 1050° C. at the pressure of 10.5 Torr, for 10 to 30 seconds. At this time, a hydrogen ($H_2$) gas and an oxygen ($O_2$) gas are simultaneously supplied while keeping the partial pressure ratio of the $H_2$ gas in a range of 2 to 20%, thereby generating O radicals and OH radicals and causing the O radicals to oxidize the insulator 5c (see FIG. 6B). This causes the insulator 5c to expand, and the insulator 5b having a thickness of approximately 3 nm can be obtained. However, in the present embodiment, instead of generating O radicals by heat, plasma may be used to generate O radicals.

When the insulator 5c is changed to the insulator 5b by radical oxidation, a layer L including a silicon (Si) element, an oxygen (O) element, and a nitrogen (N) element is formed between the insulator 5a ($SiO_2$ film) and the charge storage layer 4 (SiN film) under the influence of radicals (see FIG. 6B). The layer L is an oxide film layer including a nitrogen element, and is formed so as to extend in the Z direction in the lateral direction of the plurality of cavities H2 and the plurality of insulating layers 14 (X direction in FIG. 6B). The layer L has a thickness of, for example, 0.8 to 1.0 nm, and remains in the finally completed semiconductor device. The layer L is an example of a first layer. As described below, the nitrogen concentration in the layer L of the present embodiment is higher than the nitrogen concentration in the charge storage layer 4.

The thermal oxidation of the insulator 5c may be performed by hydroxylation, instead of using the radical oxidation. For example, the insulator 5c having a thickness of 2.3 to 2.5 nm may be hydroxylated in a vertical depressurization batch furnace in a temperature range of 850 to 950° C. at a $H_2O$ (water) partial pressure of 384 Torr, for 10 to 60 minutes. At this time, as water for hydroxylation, water vapor purified using a moisture generator is introduced into the furnace. This causes the insulator 5c to expand, and the insulator 5b having a thickness of approximately 3 nm can be obtained. The hydroxylation process of the insulator 5c in this embodiment is a process under the atmospheric pressure in which the water vapor is diluted with a nitrogen ($N_2$) gas, and may be replaced by a process in a depressurized atmosphere.

Next, the barrier metal layer 6a and the electrode material layer 6b are sequentially formed in the cavity H2 via the insulator 5b, after completing the processes illustrated in FIGS. 6A to 6C (see FIG. 5). In this manner, the semiconductor device of the present embodiment is manufactured.

Figure 7:
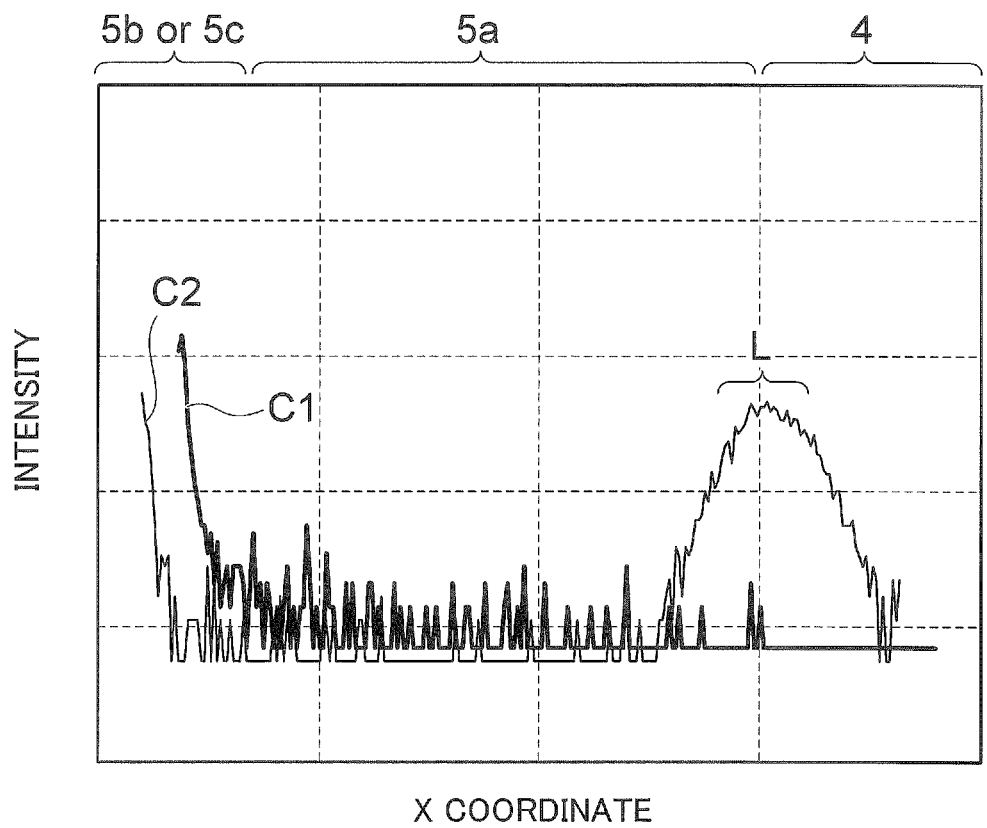
FIG. 7 is a graph illustrating the characteristics of the semiconductor device of the first embodiment.

FIG. 7 is a graph illustrating the characteristics of the semiconductor device of the first embodiment.

A curve C1 represents X-ray reflectance (XRR) measurement results for the charge storage layer 4, the insulator 5a, and the insulator 5b, before execution of the radical oxidation illustrated in FIG. 6B. A curve C2 represents XRR measurement results for the charge storage layer 4, the insulator 5a, and the insulator 5c, after execution of the radical oxidation illustrated in FIG. 6B. The horizontal axis of FIG. 7 represents the X coordinate illustrated in FIG. 6B and the like, and the vertical axis of FIG. 7 represents the intensity measured in respective XRR measurements.

As illustrated FIG. 7, the curve C2 has a peak between the charge storage layer 4 and the insulator 5a. This indicates that the layer L including nitrogen atoms at a higher concentration is formed between the charge storage layer 4 and the insulator 5a. According to the XRR measurement results, it is understood that the nitrogen concentration in the layer L is higher than the nitrogen concentration in the charge storage layer 4.

Figure 8:
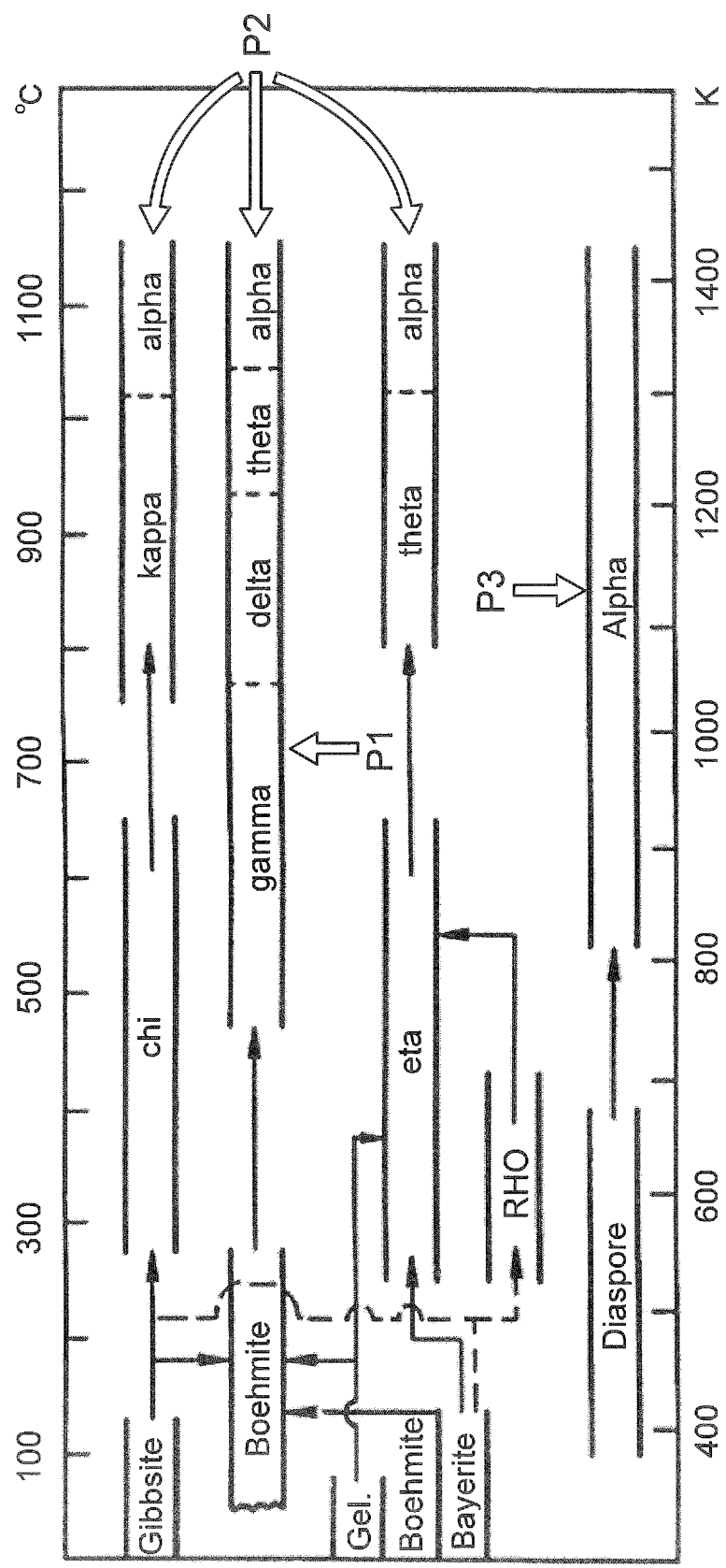
FIG. 8 is a graph illustrating the characteristics of insulators 5$b$ and 5$c$ of the first embodiment.

FIG. 8 is a graph illustrating the characteristics of the insulators 5b and 5c of the first embodiment.

FIG. 8 illustrates a relationship between the crystal structure of the $Al_2O_3$ film and the temperature. For example, an arrow P1 indicates that the $Al_2O_3$ film having the γ crystal phase can be formed in a temperature range equal to or less than of 780° C. Further, an arrow P2 indicates that the $Al_2O_3$ film having the α crystal phase can be formed at approximately 1100° C. Further, an arrow P3 illustrates that the $Al_2O_3$ film having the α crystal phase can be formed in a temperature range of approximately 800 to 1400° C.

Here, it is assumed that the aluminum oxide film ($AlO_X$ film) in the amorphous phase is changed to the aluminum oxide film ($Al_2O_3$ film) in the crystal phase by heating. In this case, if the temperature of the $AlO_X$ film is increased from the ordinary temperature to a temperature range of 500 to 1000° C., not only the $AlO_X$ film may be changed to the $Al_2O_3$ film in the α crystal phase as indicated by the arrow P3 but also the $AlO_X$ film may be changed to the $Al_2O_3$ film in the γ crystal phase as indicated by the arrow P1. In the latter case, when the temperature of the $AlO_X$ film is increased from the ordinary temperature to approximately 1100° C., the $AlO_X$ film is changed to the $Al_2O_3$ film in the γ crystal phase (the arrow P1). Subsequently, the $Al_2O_3$ film in the γ crystal phase is changed to the $Al_2O_3$ film in the α crystal phase (the arrow P2). However, as problems occurring in this case, high-temperature heating at approximately 1100° C. is required to form the $Al_2O_3$ film in the α crystal phase, and the $Al_2O_3$ film in the γ crystal phase adversely influences the formation of the $Al_2O_3$ film in the α crystal phase.

Therefore, in the present embodiment, the aluminum nitride film (AlN film) in the amorphous phase is changed to the aluminum oxide film ($Al_2O_3$ film) in the crystal phase by thermal oxidation. This makes it possible to maintain the AlN film in the amorphous phase up to at least 780° C. and change the AlN film in the amorphous phase to the $Al_2O_3$ film in the crystal phase at a temperature higher than 780° C. In this case, since the temperature of the AlN film has already passed through the temperature range of the arrow P1, the AlN film is changed to the $Al_2O_3$ film in the α crystal phase without passing through the state of the $Al_2O_3$ film in the γ crystal phase. Namely, the AlN film is changed to the $Al_2O_3$ film in the α crystal phase without nuclear formation of the γ crystal phase. Therefore, according to the present embodiment, it is possible to form the $Al_2O_3$ film in the α crystal phase (insulator 5b) without high-temperature heating at approximately 1100° C. (as indicated by the arrow P3), and prevent the $Al_2O_3$ film in the γ crystal phase from adversely influencing the formation of the $Al_2O_3$ film in the α crystal phase (insulator 5b) (as indicated by the arrow P2).

As described above, the block insulator 5 of the present embodiment includes, as the insulator 5b, the $Al_2O_3$ film in the α crystal phase. Therefore, according to the present embodiment, the performance of the block insulator 5 can be improved by the $Al_2O_3$ film in the α crystal phase.

For example, the $Al_2O_3$ film in the α crystal phase has a high dielectric constant, like the $Al_2O_3$ film in the γ crystal phase. Therefore, according to the present embodiment, using the $Al_2O_3$ film in the α crystal phase makes it possible to realize the block insulator 5 having high performances comparable to those in the case of using the $Al_2O_3$ film in the γ crystal phase.

Further, the barrier height of the $Al_2O_3$ film in the α crystal phase with respect to the Si layer is 0.7 eV higher than the barrier height of the $Al_2O_3$ film in the γ crystal phase with respect to the Si layer. Therefore, according to the present embodiment, using the $Al_2O_3$ film in the α crystal phase makes it possible to reduce the leakage current compared to the case of using the $Al_2O_3$ film in the γ crystal phase.

Further, according to the present embodiment, forming the $Al_2O_3$ film in the α crystal phase from the AlN film whose density is higher than the $AlO_X$ film makes it possible to form the insulator 5b having few defects, for example.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a stacked film including electrode layers and insulating layers that are alternately stacked in a first direction;
a first insulator, a first layer, a charge storage layer, a second insulator and a semiconductor layer that are provided in the stacked film, the first insulator being in contact with a side face of the stacked film, the first layer and the charge storage layer being provided on the side face of the stacked film via the first insulator, the first layer being provided between the first insulator and the charge storage layer, the first layer being in contact with the first insulator and the charge storage layer, the first layer including a silicon element, an oxygen element and a nitrogen element, and the semiconductor layer being provided on a side face of the charge storage layer via the second insulator; and
a third insulator provided between an electrode layer of the electrode layers and an insulating layer of the insulating layers and between the electrode layer and the first insulator, and including aluminum oxide having an α crystal phase,
wherein the charge storage layer includes a silicon element and a nitrogen element, and
a nitrogen concentration in the first layer is higher than a nitrogen concentration in the charge storage layer.

2. The device of claim 1, wherein the first insulator includes a silicon element and an oxygen element.

3. The device of claim 1, wherein the first layer is provided along the first direction.

4. The device of claim 1, wherein a thickness of the first layer is equal to or less than 1.0 nm.

5. The device of claim 1, wherein a thickness of the first layer is equal to or greater than 0.8 nm.

6. The device of claim 1, wherein the first insulator is a block insulator, and the second insulator is a tunnel insulator.

7. The device of claim 1, wherein a nitrogen concentration in the first layer is higher than a nitrogen concentration in the first insulator.

* * * * *